(12) United States Patent
Shimizu et al.

(10) Patent No.: US 7,916,534 B2
(45) Date of Patent: Mar. 29, 2011

(54) SEMICONDUCTOR MEMORY DEVICE

(75) Inventors: Takahiro Shimizu, Yokohama (JP); Noboru Shibata, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 542 days.

(21) Appl. No.: 11/737,373

(22) Filed: Apr. 19, 2007

(65) Prior Publication Data
US 2007/0285980 A1    Dec. 13, 2007

(30) Foreign Application Priority Data

May 10, 2006  (JP) ................................. 2006-131800

(51) Int. Cl.
*G11C 16/04* (2006.01)
(52) U.S. Cl. .......... 365/185.03; 365/189.05; 365/230.03
(58) Field of Classification Search ............. 365/185.03, 365/189.04, 230.03, 189.05
See application file for complete search history.

(56) References Cited

U.S. PATENT DOCUMENTS

| | | | | |
|---|---|---|---|---|
| 5,930,167 A | * | 7/1999 | Lee et al. ................. | 365/185.03 |
| 6,122,193 A | | 9/2000 | Shibata et al. | |
| 6,496,409 B2 | | 12/2002 | Kobayashi et al. | |
| 6,933,194 B2 | | 8/2005 | Narita et al. | |
| 2006/0227602 A1 | * | 10/2006 | Honma et al. ........... | 365/185.03 |
| 2007/0211530 A1 | * | 9/2007 | Nakano .................... | 365/185.08 |
| 2008/0104309 A1 | * | 5/2008 | Cheon et al. .................. | 711/103 |

FOREIGN PATENT DOCUMENTS

JP    2002-16154    1/2002

OTHER PUBLICATIONS

U.S. Appl. No. 12/060,630, filed Apr. 1, 2008, Tanaka.
U.S. Appl. No. 12/840,567, filed Jul. 21, 2010, Shibata, et al.

* cited by examiner

*Primary Examiner* — Vu A Le
*Assistant Examiner* — Han Yang
(74) *Attorney, Agent, or Firm* — Oblon, Spivak, McClelland, Maier & Neustadt, L.L.P.

(57) ABSTRACT

A semiconductor memory device of the invention comprises a memory cell array which includes a first region that has a plurality of memory cells each capable of storing n-bit data (n is a natural number) and a second region that has a plurality of memory cells each capable of storing k-bit data (k>n: k is a natural number), a data storage circuit which includes a plurality of data caches, and a control circuit which controls the memory cell array and the data storage circuit in such a manner that the k-bit data read from the k/n number of memory cells in the first region are stored into the data storage circuit and the k-bit data are stored into the memory cells in the second region.

20 Claims, 17 Drawing Sheets

FIG. 4A 11-1 MLC region (16 levels (4 bits))

| | 0 | 1 | 2 | 3 | 4 | 5 | 6 | 7 | 8 | 9 | A | B | C | D | E | F |
|---|---|---|---|---|---|---|---|---|---|---|---|---|---|---|---|---|
| 41-1 Data cache | 1 | 0 | 0 | 1 | 1 | 0 | 0 | 1 | 1 | 0 | 0 | 1 | 1 | 0 | 0 | 1 |
| 41-2 Data cache | 1 | 1 | 0 | 0 | 0 | 0 | 1 | 1 | 1 | 1 | 0 | 0 | 0 | 0 | 1 | 1 |
| 41-3 Data cache | 1 | 1 | 1 | 1 | 0 | 0 | 0 | 0 | 0 | 0 | 0 | 0 | 1 | 1 | 1 | 1 |
| 41-4 Data cache | 1 | 1 | 1 | 1 | 1 | 1 | 1 | 1 | 0 | 0 | 0 | 0 | 0 | 0 | 0 | 0 |

FIG. 4B 11-2 SLC region (2 levels (1 bits))

| | 0 | 1 |
|---|---|---|
| 41-1 Data cache | 1 | 0 |
| 41-2 Data cache | · | · |
| 41-3 Data cache | · | · |
| 41-4 Data cache | · | · |

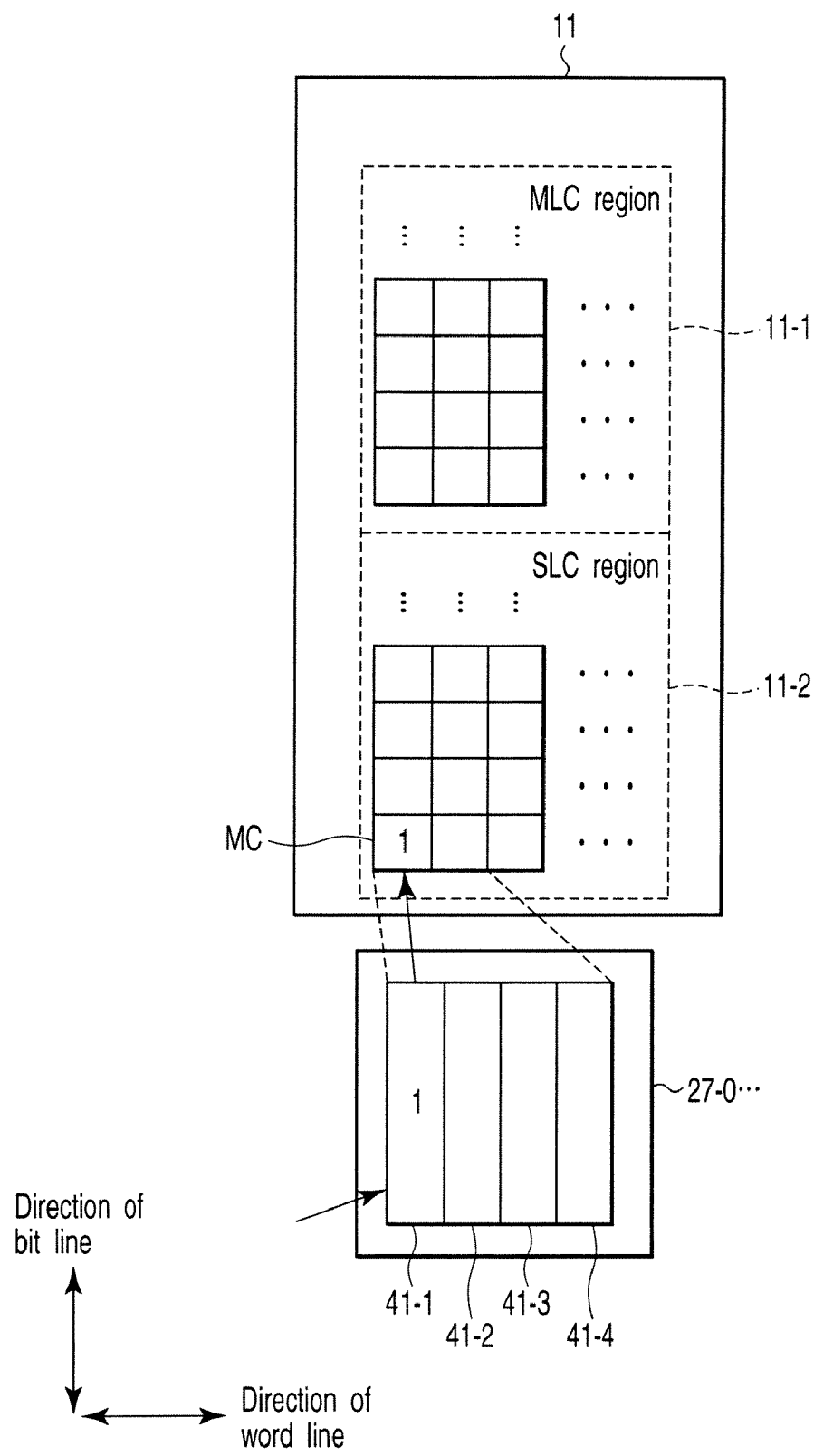
F I G. 7

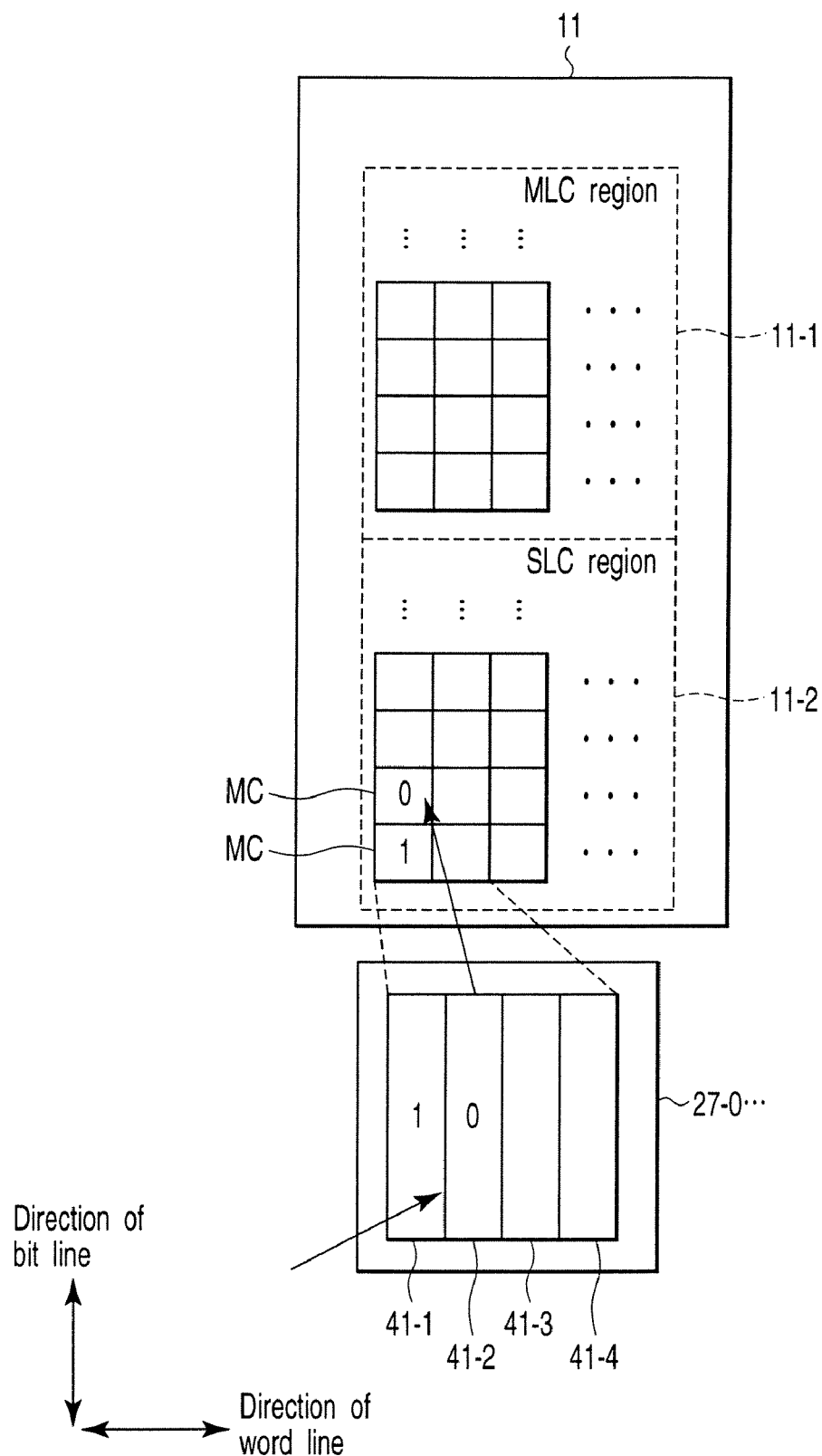
F I G. 8

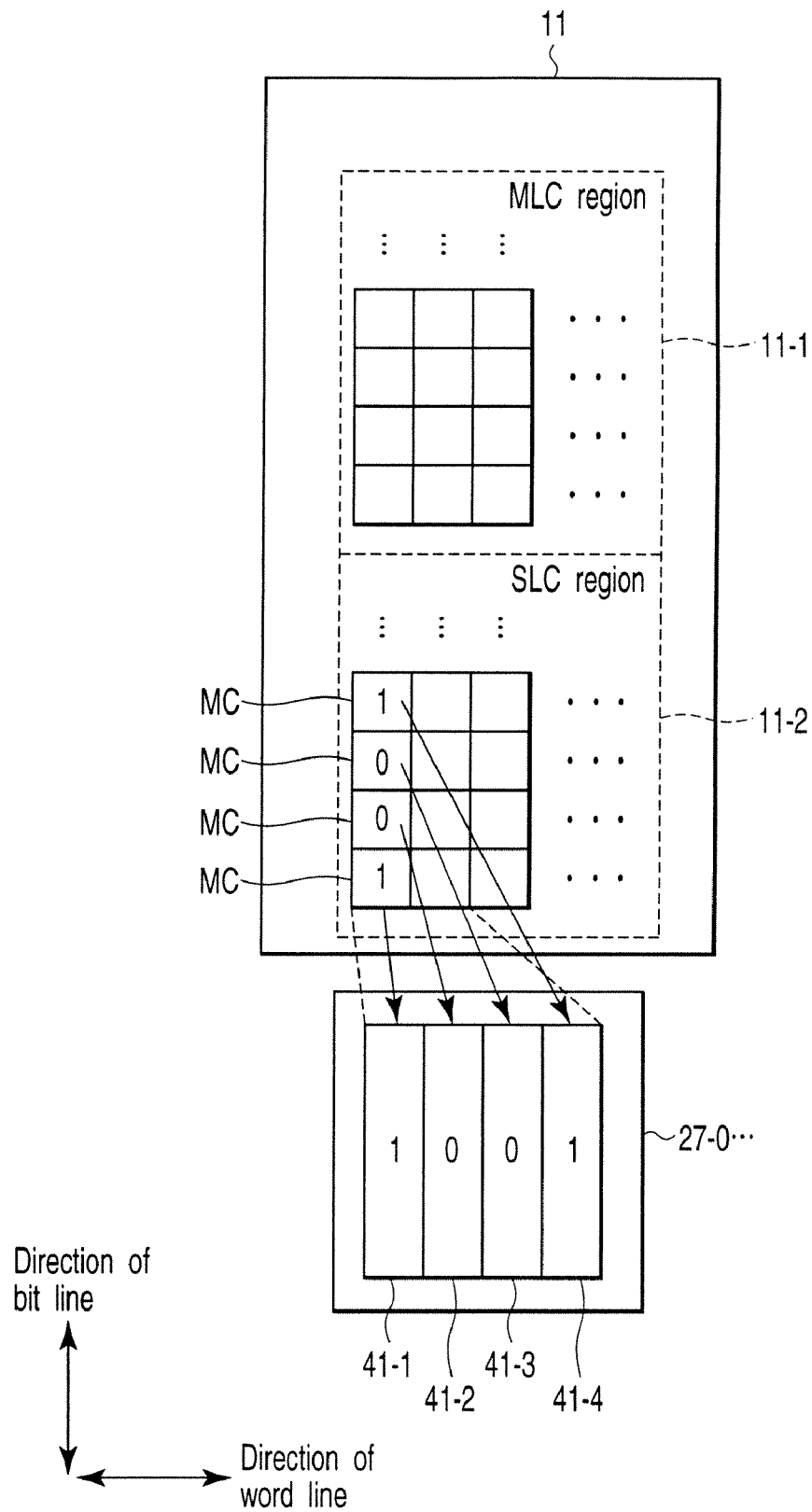
F I G. 12

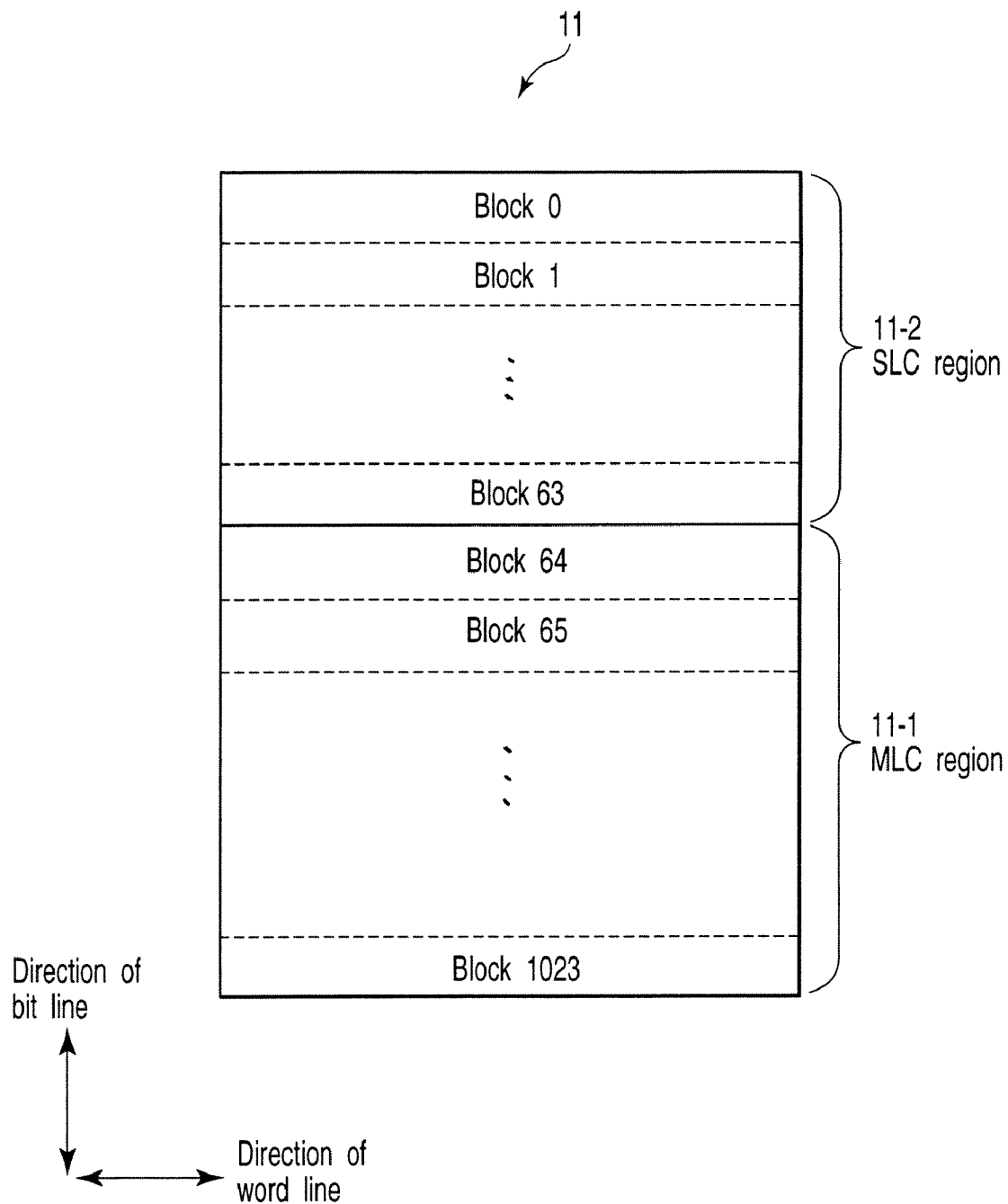
F I G. 20

SEMICONDUCTOR MEMORY DEVICE

CROSS-REFERENCE TO RELATED APPLICATIONS

This application is based upon and claims the benefit of priority from prior Japanese Patent Application No. 2006-131800, filed May 10, 2006, the entire contents of which are incorporated herein by reference.

BACKGROUND OF THE INVENTION

1. Field of the Invention

This invention relates to a semiconductor memory device, and more particularly to a semiconductor memory device applied to, for example, a NAND flash memory.

2. Description of the Related Art

NAND flash memories, semiconductor memory devices, have been available in the market and widely used. The NAND flash memories come in two types: one is a single-level NAND flash memory capable of storing 1 bit of data in a single memory cell and the other is a multilevel NAND flash memory capable of storing a plurality of pieces of data in a single memory cell (refer to, for example, Jpn. Pat. Appln. KOKAI Publication No. 2002-016154).

Since a multilevel NAND flash memory can store a plurality of pieces of data in a single memory cell, it can realize two or more times the capacity of a single-level NAND flash memory with the same area. Therefore, with the recent demands for a larger capacity of a flash memory, the multilevel NAND flash memory has been attracting attention.

However, the data write time of the multilevel NAND flash memory has to be, for example, about two to three times that of the single-level NAND flash memory, which is disadvantageous to speeding up. For example, when 2 bits of data are stored in a single memory, four threshold voltage have to be set, which makes it necessary to make the distribution width of the threshold voltage narrower than that of the single-level NAND flash memory. To perform control so as to make the distribution width of the threshold voltage narrower, it is necessary to repeat a program and a program verify read operation, which decreases the write speed and therefore increases the write time.

Furthermore, when 3 bits of data or 4 bits of data are stored in a single memory cell, 8 threshold voltages or 16 threshold voltages have to be set. For this reason, to store more items of data, it is necessary to make the distribution of threshold voltages narrower, making the write speed much slower, which is disadvantageous to speeding up.

On the other hand, when a memory cell array is made up of single-level NAND flash memories, it is advantageous to speeding up. However, only one bit of data can be stored in a single memory, which is disadvantageous to making the capacity larger.

BRIEF SUMMARY OF THE INVENTION

According to a first aspect of the invention, there is provided a semiconductor memory device comprising: a memory cell array which includes a first region that has a plurality of memory cells each capable of storing n-bit data (n is a natural number) and a second region that has a plurality of memory cells each capable of storing k-bit data (k>n: k is a natural number); a data storage circuit which includes a plurality of data caches; and a control circuit which controls the memory cell array and the data storage circuit in such a manner that the k-bit data read from the k/n number of memory cells in the first region are stored into the data storage circuit and the k-bit data are stored into the memory cells in the second region.

According to a second aspect of the invention, there is provided a semiconductor memory device comprising: a memory cell array which include a first region that has a plurality of memory cells each capable of storing n-bit data (n is a natural number) and a second region that has a plurality of memory cells each capable of storing k-bit data (k>n: k is a natural number); a data storage circuit which includes a plurality of data caches; and a control circuit which controls the memory cell array and the data storage circuit so as to decentralize write operations by specifying an address in the memory cell array to prevent write operations from concentrating on a specific one of the memory cells.

BRIEF DESCRIPTION OF THE SEVERAL VIEWS OF THE DRAWING

FIG. 4A is a diagram to help explain the relationship between the threshold voltages of a memory cell and data stored in the data caches in the MLC region;

FIG. 4B is a diagram to help explain the relationship between the threshold voltages of a memory cell and data stored in the data caches in the SLC region;

FIG. 7 is a diagram to help explain a data input operation and a write operation in the SLC region in the semiconductor memory device of the first embodiment (in the case of a single write operation);

FIG. 8 is a diagram to help explain a data input operation and a write operation in the SLC region in the semiconductor memory device of the first embodiment (in the case of a single write operation);

FIG. 12 is a diagram to help explain a read operation in the SLC region of the semiconductor memory device of the first embodiment;

FIG. 20 is a plan view of the memory cell array in the third embodiment.

DETAILED DESCRIPTION OF THE INVENTION

Figure 1:
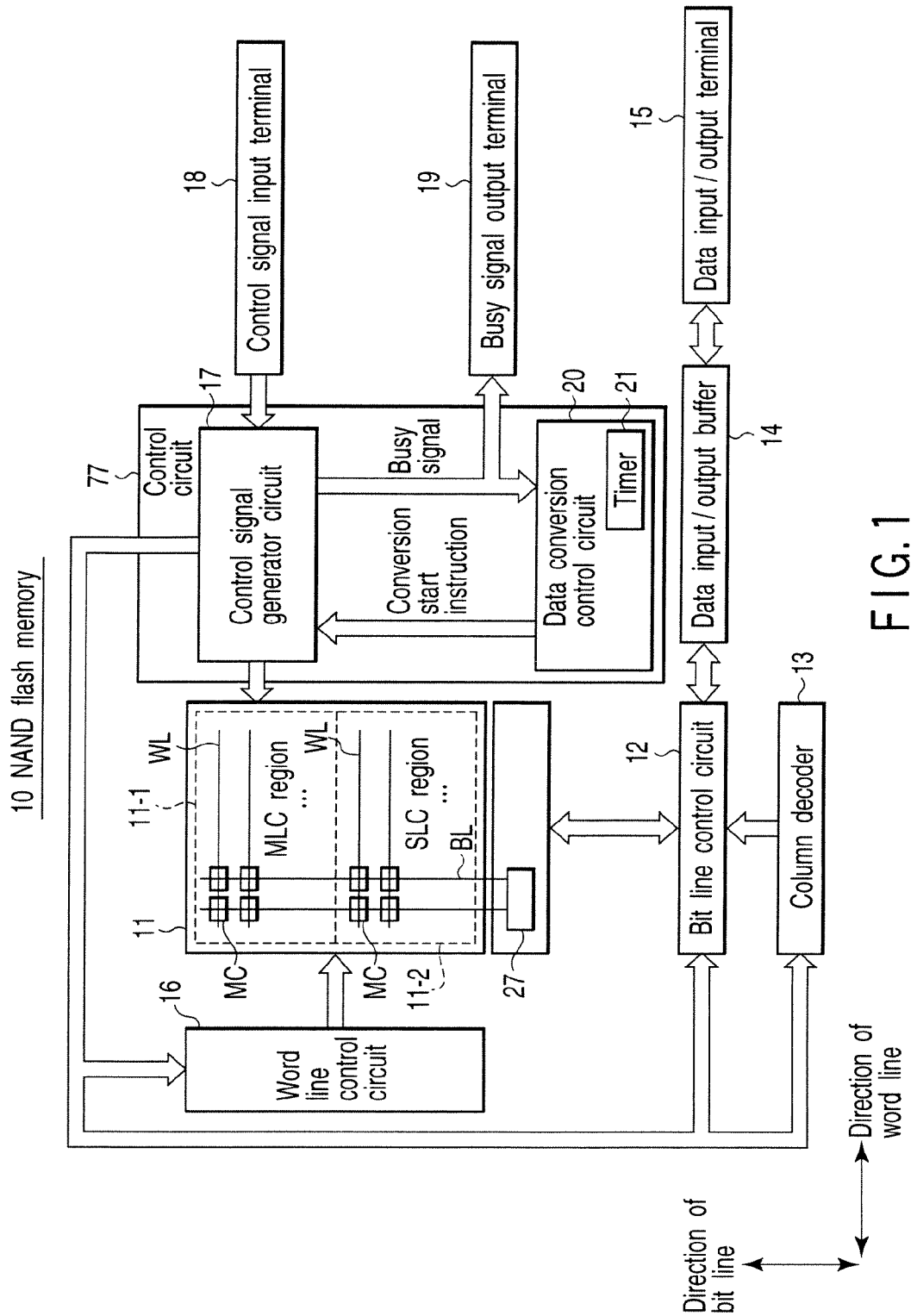
FIG. 1 is a block diagram of a semiconductor memory device according to a first embodiment of the invention.

Hereinafter, referring to the accompanying drawings, embodiments of the invention will be explained. In the explanation below, the same parts are indicated by the same reference numerals throughout the drawings.

First Embodiment

Using FIGS. 1 to 14, a semiconductor memory device according to a first embodiment of the invention will be explained. FIG. 1 is a block diagram of a semiconductor memory device according to the first embodiment. In the embodiment, a NAND flash memory is taken as an example.

As shown in FIG. 1, the NAND flash memory 10 comprises a memory cell array 11, a data storage circuit 27, a bit line control circuit 12, a column decoder 13, a data input/output buffer 14, a data input/output terminal 15, a word line control circuit 16, a control signal input terminal 18, a busy signal output terminal 19, and a control circuit 77 which has a control signal generator circuit 17 and a data conversion control circuit 20.

The memory cell array 11 includes an MLC (Multi Level Cell) region 11-1 which has as memory cells MC multilevel NAND flash memories capable of recording a plurality of bits of data into a single memory and an SLC (Single Level Cell) region 11-2 which has as memory cells MC single-level NAND flash memories capable of recording 1 bit of data into a single memory. The individual memory cells MC are arranged in a matrix at the intersections of a plurality of word lines WL and a plurality of bit lines BL.

In the first embodiment, explanation will be given, using a case where the number of bits in a multilevel NAND flash memory in the MCL region 11-1 is 4 bits (16 levels) and the number of bits in a single-level NAND flash memory in the SLC region 11-1 is 1 bit (single level).

The data storage circuit 27, which has a plurality of data caches, is used for both of the MCL region 11-1 and SLC region 11-2 in a write and a read operation described later.

The bit line control circuit 12 is so configured that it controls the potential on a bit line BL, thereby reading the data in a memory cell MC in the memory cell array 11 via the bit line BL, detecting the state of the memory cell MC, and applying a write control data to the memory cell MC to write the data into the memory cell.

The column decoder 13 is configured to control the bit line control circuit 12 so as to select the data storage circuit 27. For example, the column decoder 13 inputs to the selected data storage circuit 27 the write data input via the data input/output terminal 15 from the outside and temporarily stored in the data input/output buffer 14.

The data input/output buffer 14 is configured to temporarily hold the read-out data in the memory cell MC read from the data storage circuit 27 and the write data input from the outside.

Data is input from and output to the outside via the data input/output terminal 15.

The word line control circuit 16 is electrically connected to the memory cell array 11. The word line control circuit 16 is configured to select a word line WL in the memory cell array 11 and apply a voltage necessary for reading, writing, or erasing to the selected word line WL.

The control circuit 77 includes the control signal generator circuit 17 and a data conversion control circuit 20. The control circuit 77 is configured to control the memory cell array 11 and data storage circuit 27 as described below. In a write operation or a read operation, the control circuit 77 stores a plurality of pieces of data read from the SLC region 11-2 into a plurality of data caches. Then, the control circuit 77 stores an arbitrary number of bits in the plurality of pieces of data stored in the plurality of data caches into the memory cells MC in the MLC region at the address selected according to the number of bits in the memory cell MC in the MLC region 11-1.

The control signal generator circuit 17 is connected electrically to the memory cell array 11, bit line control circuit 12, column decoder 13, word line control circuit 16, and data conversion control circuit 20.

The control signal generator circuit 17 is so configured that it specifies an address so as to control the memory cell array 11 in such a manner that frequently rewritten data is written into the SLC region 11-2 and less frequently rewritten data is written into the MLC region 11-1. As described above, the control signal generator circuit 17 has the function of specifying an address to prevent write operations from concentrating on a specific memory cell and decentralizing write operations (leveling function).

The data conversion control circuit 20, which has a timer 21 in it, causes the timer 21 to count the time during which the control signal generator circuit 17 outputs no busy signal. Then, the data conversion control circuit 20 is so configured that, after a specific time has passed since the output of the busy signal was stopped, it determines that the data storage circuit 27 is in the standby state and outputs a data conversion start instruction to the control signal generator circuit 17.

Figure 2:
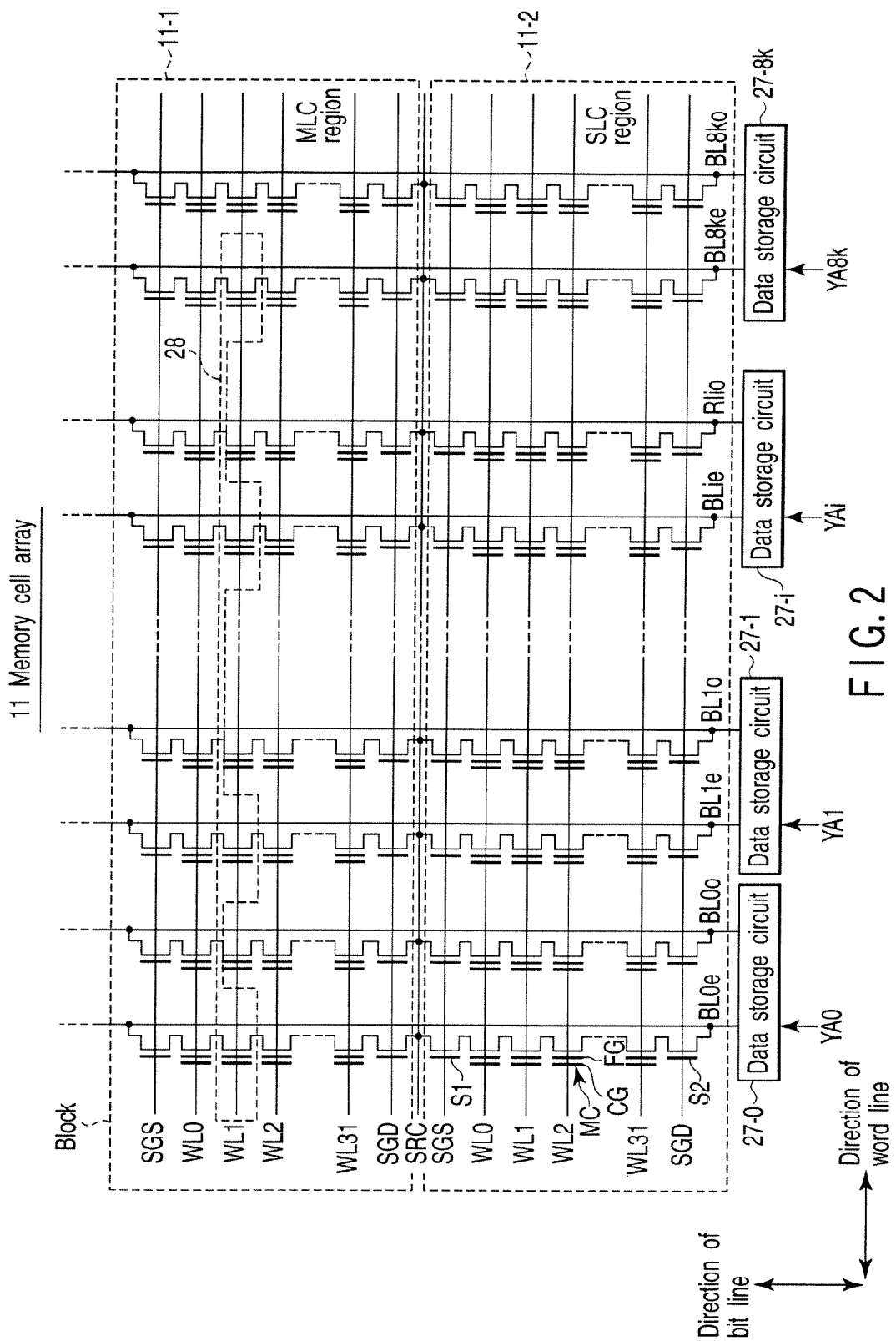
FIG. 2 is a circuit diagram of the memory cell array in FIG. 1.

Next, using FIG. 2, the memory cell array 11 will be explained in more detail. FIG. 2 is a circuit diagram of an example of the memory cell array in the semiconductor memory device according to the first embodiment.

As shown in FIG. 2, the memory cell array 11 has a plurality of memory cells MC arranged in a matrix at the intersections of word lines WL and bit lines BL. Each of the memory cells MC has a stacked structure which includes a tunnel insulating film provided on a semiconductor substrate, a floating electrode FG provided on the tunnel insulating film, an inter-gate insulating film provided on the floating electrode FG, and a control electrode CG provided on the inter-gate insulating film. Memory cells MC adjacent to each other in the direction of bit line BL share a source/drain acting as a current path. One end and the other end of each of the current paths are arranged in such a manner that, for example, 32 current paths are connected in series.

The memory cells MC one end and the other end of which are connected in series and select transistors S1, S2 constitute a NAND cell column. The select transistors ST1, ST2 select the NAND cell column. One end of the current path of the NAND cell column is connected via a data storage circuit 27 to a sense amplifier (not shown). The other end of the current path is connected to a source line SRC.

The number of memory cells is not limited to 32 in the first embodiment. For instance, the number of memory cells may be 8 or 16. As long as the NAND cell column can be selected, only one of the select transistors ST1, ST2 may be provided.

The control electrodes CG of the memory cells in the direction of each row (or the direction of word line WL) are connected equally to any one of word line WL0 to word line WL31. The gates of the select transistors ST1 are connected equally to a select gate SGS. The gates of the select transistors ST2 are connected equally to a select gate SGD. The source of the select transistor S1 is connected to a source line SRC. The drain of the select transistor ST2 is connected to any one of bit line BL0e to bit line BL8ko.

To pairs of bit lines (BL0e, BL0o), (BL1e, BL1o), . . . , (BLie, BLio), (BL8ke, BL8ko), the data storage circuits 27-0 to 27-8K are connected respectively. A pair of bit lines (BL0e, BL0o) and others are selected according to an externally supplied address signal (YA0, YA1, . . . , YAi, . . . , YA8k) in a read operation, a program verify operation, or a program operation.

The memory cell array 11 includes a plurality of blocks. Some of the blocks are used as the SLC region 11-2 and the rest are used as the MLC region 11-1. An erase operation is performed simultaneously on the two bit lines BL connected to the data storage circuit 27. Each block is composed of a plurality of units of the NAND cell column.

A plurality of memory cells (or the memory cells enclosed by a broken line 28) arranged for every other bit line BL in the direction of word line WL constitute a sector. For example, in the MLC region 11-1, a second page exists in one sector. In the SLC region 11-1, a first page exists in one sector. Data is written or read in pages.

According to an external address, a single word line WL is selected. When the MLC region 11-1 is to be processed, pages are changed using an address.

In selecting an address in a write operation, the control signal generator circuit 17 may specify an address (or do leveling) in such a manner that the memory cells MC to be written into are decentralized within the SLC region 11-2 or the MLC region 11-1. This prevents write operations from concentrating on a specific memory cell MC, which improves the reliability.

Figure 3:
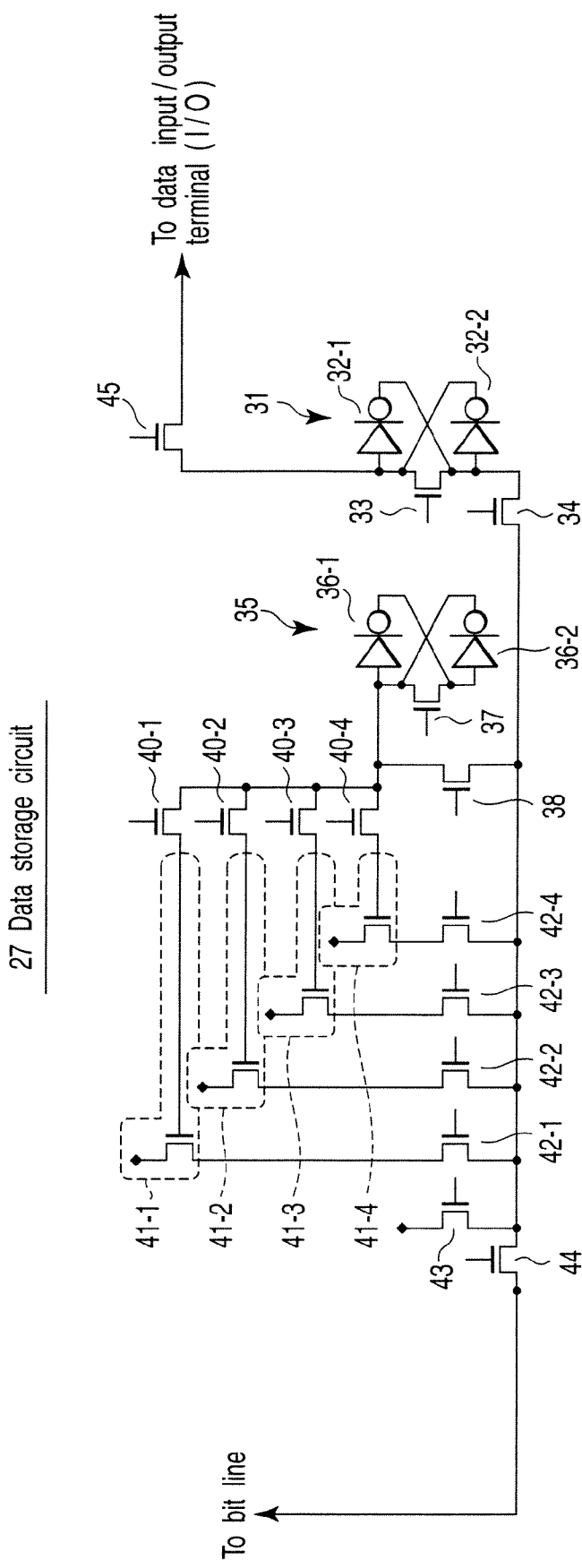
FIG. 3 is a circuit diagram of the data storage circuit in FIG. 1.

Next, using FIGS. 3 and 4, the data storage circuit 27 will be explained in detail. FIG. 3 is a circuit diagram of an example of the data storage circuit according to the first embodiment. The data storage circuit 27-0 is taken as an example.

As shown in FIG. 3, the data storage circuit 27-0 includes a latch circuit 31, an amplifier circuit 35, and four data caches 41-1 to 41-4.

The latch circuit 31 is configured to store data temporarily in transferring the data input from the data input/output terminal (I/O) 15 to the data caches 41-4 to 41-4 or in transferring the data in the data caches 41-4 to 41-4 to the data input/output terminal (I/O) 15. The latch circuit 31 includes inverters 32-1, 32-2, and transistors 33, 34.

When a transistor 45 is selected, the data from the data input/output terminal 15 is held temporarily by the inverters 31-1, 32-2. The input end of the inverter 32-1 is connected to the output end of the inverter 32-2. The output end of the inverter 32-1 is connected to the input end of the inverter 32-2. One end of the current path of the transistor 33 is connected to the input end of the inverter 32-1. The other end of the current path of the transistor 33 is connected to the output end of the inverter 32-1. One end of the current path of the transistor 34 is connected to the output end of the inverter 32-1. The other end of the current path of the transistor 34 is connected to the amplifier circuit 35.

The amplifier circuit 35 is configured to amplify the data from the data caches 41-1 to 41-4. The amplifier circuit 35 includes inverters 36-1, 36-2 and transistors 37, 38.

When the transistor 38 and transistors 40-1 to 40-4 are selected, the data from the data caches 41-1 to 41-4 are held temporarily by the inverters 36-1, 36-2. After the data has been held, when the transistors 40-1 to 40-4 are selected, the amplified data is transferred to the data caches 41-1 to 41-4. The input end of the inverter 36-1 is connected to the output end of the inverter 36-2. The output end of the inverter 36-1 is connected to the input end of the inverter 36-2. One end of the current path of the transistor 37 is connected to the input end of the inverter 36-1. The other end of the current path of the transistor 37 is connected to the output end of the inverter 36-1. One end of the current path of the transistor 38 is connected to the output of the data caches 41-1 to 41-4. The other end of the current path of the transistor 38 is connected to the data input/output terminal 15.

In the middle of writing, it is determined whether to do writing or stop writing, on the basis of the data stored in the amplifier circuit 35. For example, when the amplifier circuit 35 stores "0", writing is done. After writing has been completed, "1" is stored in the amplifier circuit 35, which ends the write operation.

The data caches 41-1 to 41-4 are configured to store write data and read data.

When the transistors 44, 38, 40-1 are turned on and conducts to a bit line BL, the data cache 41-1 stores the data in the memory cell into the part enclosed by a broken line. When the transistors 41-1, 42-1, 34 are selected, the stored data is output via the latch circuit 31 to the data input/output terminal. The same is true for the remaining data caches 41-2 to 41-4.

FIG. 4A is a diagram to help explain the relationship between the threshold voltages of a memory cell MC and the data stored in the data caches 41-1 to 41-4 in the MLC region 11-1 (16 levels in the embodiment). FIG. 4B is a diagram to help explain the relationship between the threshold voltages of a memory cell MC and the data stored in the data caches 41-1 to 41-4 in the SLC region (2 levels in the embodiment).

As shown in FIG. 4A, the threshold voltages "0" to "F" in a memory cell MC in the MLC region 11-1 are stored into the data caches 41-1 to 41-4 so as to correspond to "1111" to "1110", respectively. As shown in FIG. 4B, the threshold voltage "0" or "1" in a memory cell MC in the SLC region 11-2 is stored in the data cache 41-1 so as to correspond to "1" or "0".

When the data storage circuit 27-0 has only one unit of the data cache, only one bit can be determined. Therefore, only two threshold distributions can be formed from one threshold distribution in one write operation. For example, when 4 bits are stored in a single memory cell, two threshold distributions are formed from one threshold distribution and then, threshold distributions are increased in number in such a manner that 4 threshold distributions are formed from 2 threshold distributions, 8 threshold distributions are formed from 4 threshold distributions, and 16 threshold distributions are formed from 8 threshold distributions. This is disadvantageous to speeding up. In the embodiment, since four data caches 41 are provided, it is possible to determine four bits. Therefore, 16 threshold distributions can be formed simultaneously from one threshold distribution in one write operation.

<Write and Read Operations>

Figure 5:
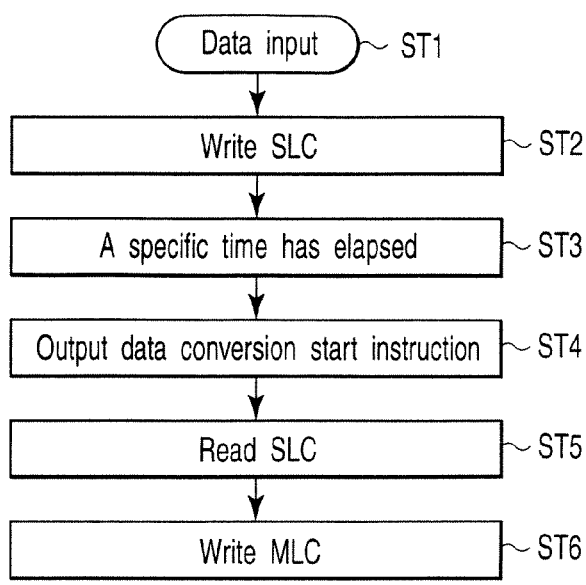
FIG. 5 is a flowchart to help explain a write operation and a read operation in the semiconductor memory device according to the first embodiment.

Next, using FIGS. 5 to 14, a write operation and a read operation in the semiconductor memory device according to the first embodiment will be explained. FIG. 5 is a flowchart to help explain a write operation and a read operation in the first embodiment. Hereinafter, explanation will be given using the flowchart.

(Step ST1 (Example of a Single Write Operation in Data Input))

Figure 6:
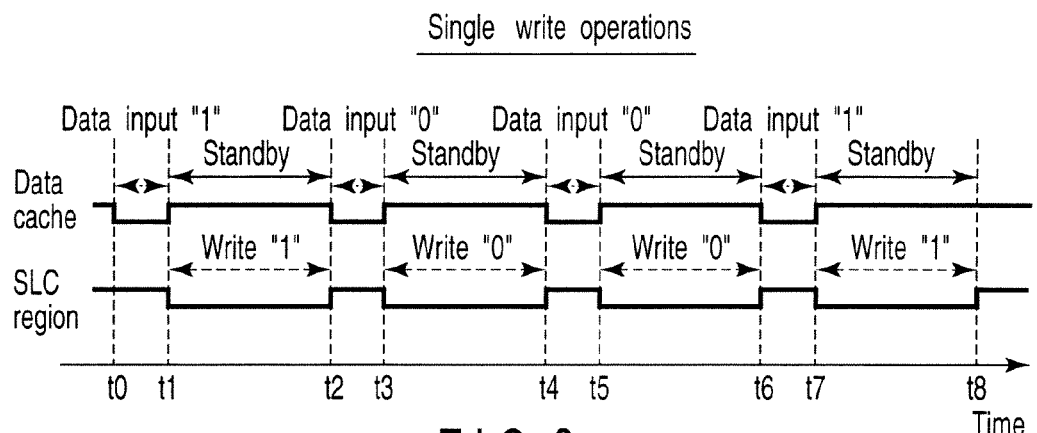
FIG. 6 is a timing chart to help explain a data input operation and a write operation in the SLC region in the semiconductor memory device of the first embodiment (in the case of a single write operation)

As shown in FIGS. 6 and 7, at time t0, data "1" to be written is input from the data input/output terminal 15 and then is stored in the data cache 41-1 of the data storage circuit 27-0.

(Step ST2 (Example of a Single Write Operation in the SLC Region))

Then, as shown in FIGS. 6 and 8, at time t1, data "1" stored in the data cache 41-1 is written into the selected memory cell MC in the SLC region 11-2. Moreover, at time t1, the control signal generator circuit 17 senses that the memory cell array 11 is in operation. Then, the control signal generator circuit 17 outputs a busy signal to the data conversion control circuit 20 and busy signal output terminal 19, thereby informing the outside world of the operating state.

At time t1, an Error Correction Code (ECC) for binary data is also written at the same time. Taking into account the fact that the data is rewritten in 16 levels into the MLC region 11-1 later, ECC for 16-level data may be written in advance at time t1.

Then, at time t2, when the writing of data "1" into the memory cell MC has been completed, the control signal generator circuit 17 stops the output of the busy signal. In the meantime (between time t1 and time t2), the data cache 41-1 is in the standby state.

Then, in the period from time t4 to time 9, the same operation is performed on the data caches 41-2 to 41-4 and the memory cells MC in the SLC region, which completes the write operation in the SLC region 11-2.

(Step ST1 (Example of Consecutive Write Operations in Data Input)

Figure 9:
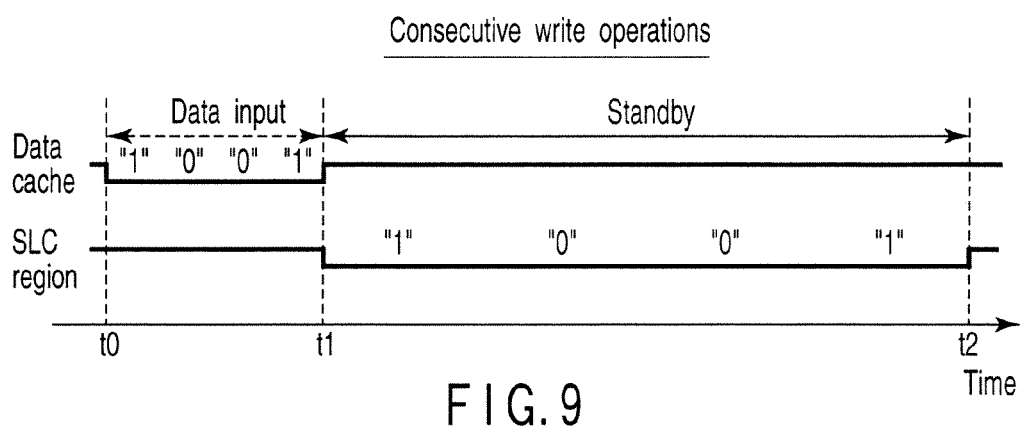
FIG. 9 is a timing chart to help explain a data input operation and a write operation in the SLC region in the semiconductor memory device of the first embodiment (in the case of consecutive write operations)
Figure 10:
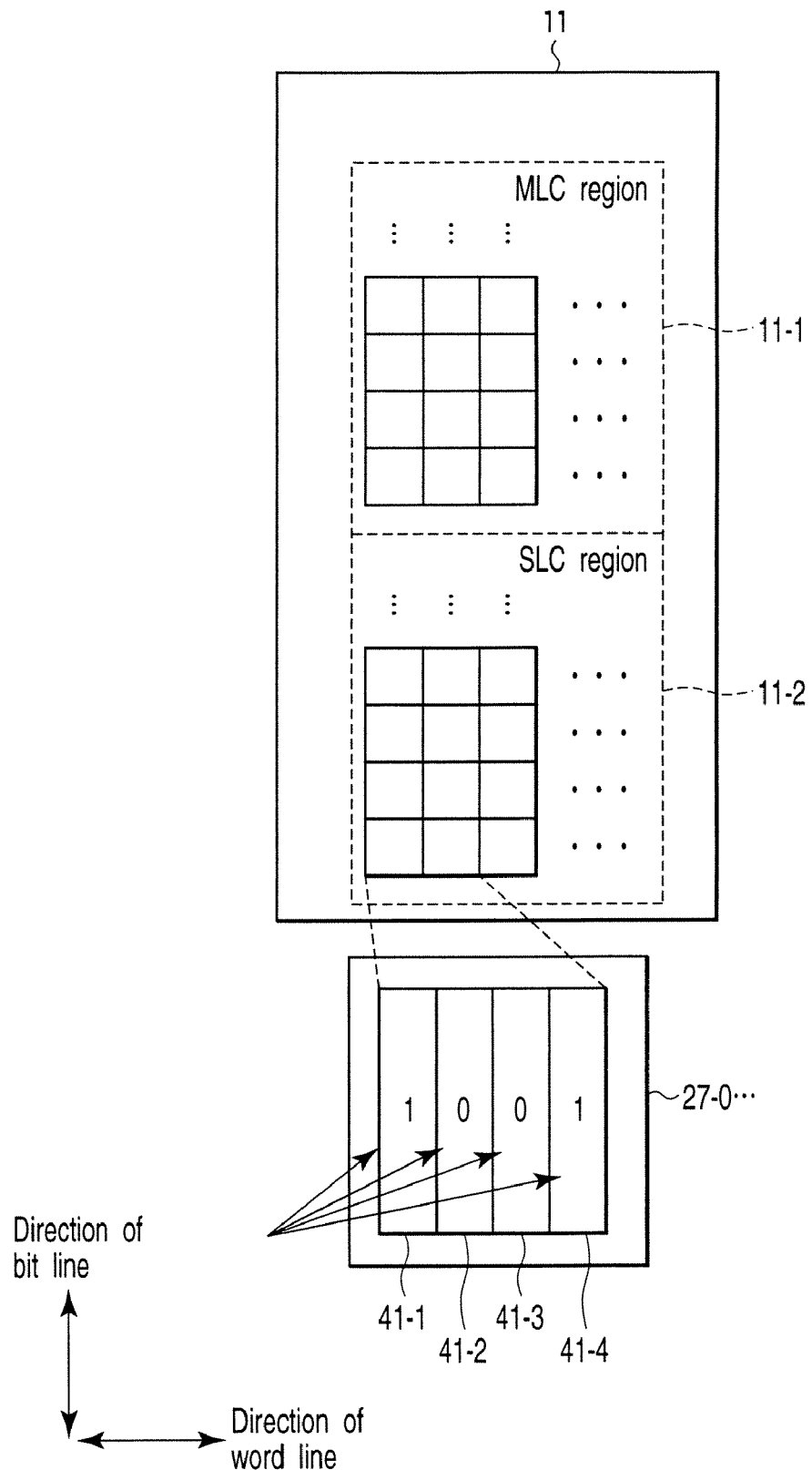
FIG. 10 is a diagram to help explain a data input operation in the semiconductor memory device of the first embodiment (in the case of consecutive write operations)
Figure 11:
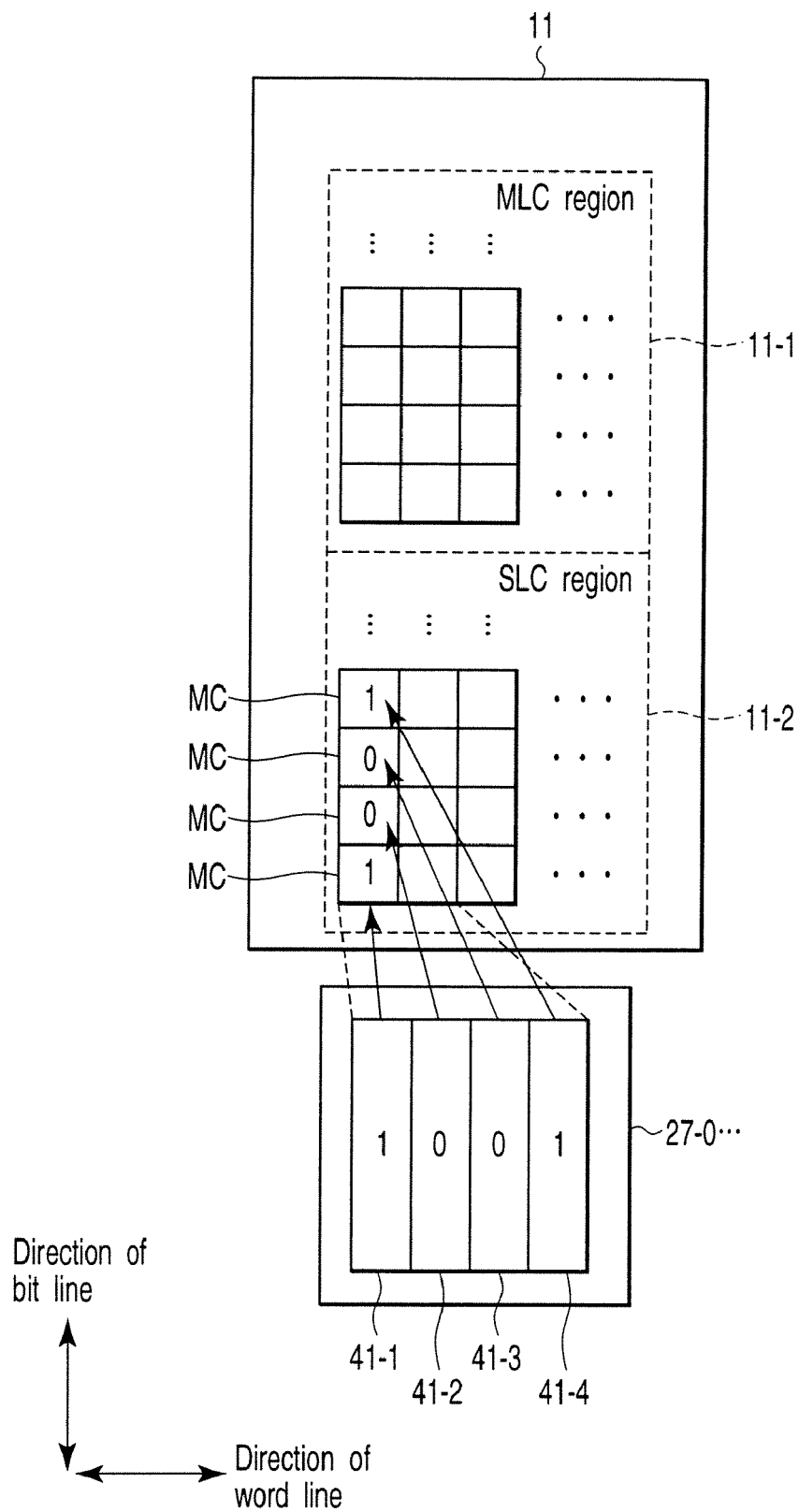
FIG. 11 is a diagram to help explain a write operation in the SLC region of the semiconductor memory device of the first embodiment (in the case of consecutive write operations)

Furthermore, in the embodiment, as shown in FIGS. 9 to 11, after data is input consecutively to the data caches 41-1 to 41-4, a write operation can be performed consecutively on the SLC region.

First, as shown in FIGS. 9 and 10, at time t0, all the data to be written, "1", "0", "0", and "1", are input from the data input/output terminal 15 and then are stored in the data caches 41-1 to 41-4 of the data storage circuit 27-0 consecutively.

(Step ST2 (Example of Consecutive Write Operations in the SLC Region))

Next, as shown in FIGS. 9 and 11, at time t1, all the data "1", "0", "0", and "1" stored in the data caches 41-1 to 41-4 are written consecutively into the four selected memory cells MC in the SLC region. Moreover, at time t1, the control signal generator circuit 17 senses that the memory cell array 11 is in operation. Then, the control signal generator circuit 17 outputs a busy signal to the data conversion control circuit 20 and busy signal output terminal 19, thereby informing the outside world of the operating state.

Then, at time t2, when the writing of data into the memory cell MC has been completed, the control signal generator circuit 17 stops the output of the busy signal. In the meantime (between time t1 and time t2), the data caches 41-1 to 41-4 are in the standby state.

(Step ST3)

Then, the timer 12 in the data conversion control circuit 20 senses that a specific time has passed. The passage of the specific time is sensed by counting the time during which the busy signal is not output with the timer 21.

(Step ST4)

After sensing that the specific time has passed, the data conversion circuit 20 outputs a conversion start instruction to the control signal generator circuit 17.

The specific time can be set in advance and regulated arbitrarily. A conversion start command to cause a conversion start instruction to be transmitted immediately can be input from the outside via the control signal input terminal 18.

(Step ST5)

Then, as shown in FIG. 12, receiving the conversion start instruction, the control signal generator circuit 17 starts data conversion.

Specifically, the control signal generator circuit 17 reads data "1" written in the memory cell MC in the SLC region. Moreover, the control signal generator circuit 17 stores the read-out data into one data cache 41-1. The same operation is performed on another page. The read-out data, "0", "0", and "1", are stored in the data caches 41-2 to 41-4.

In the embodiment, since the MLC region 11-1 to be converted is in 16 levels, a total of four read operations are carried out consecutively as described above.

(Step ST6 (Data Compression from the SLC Region to the MLC Region))

Figure 13:
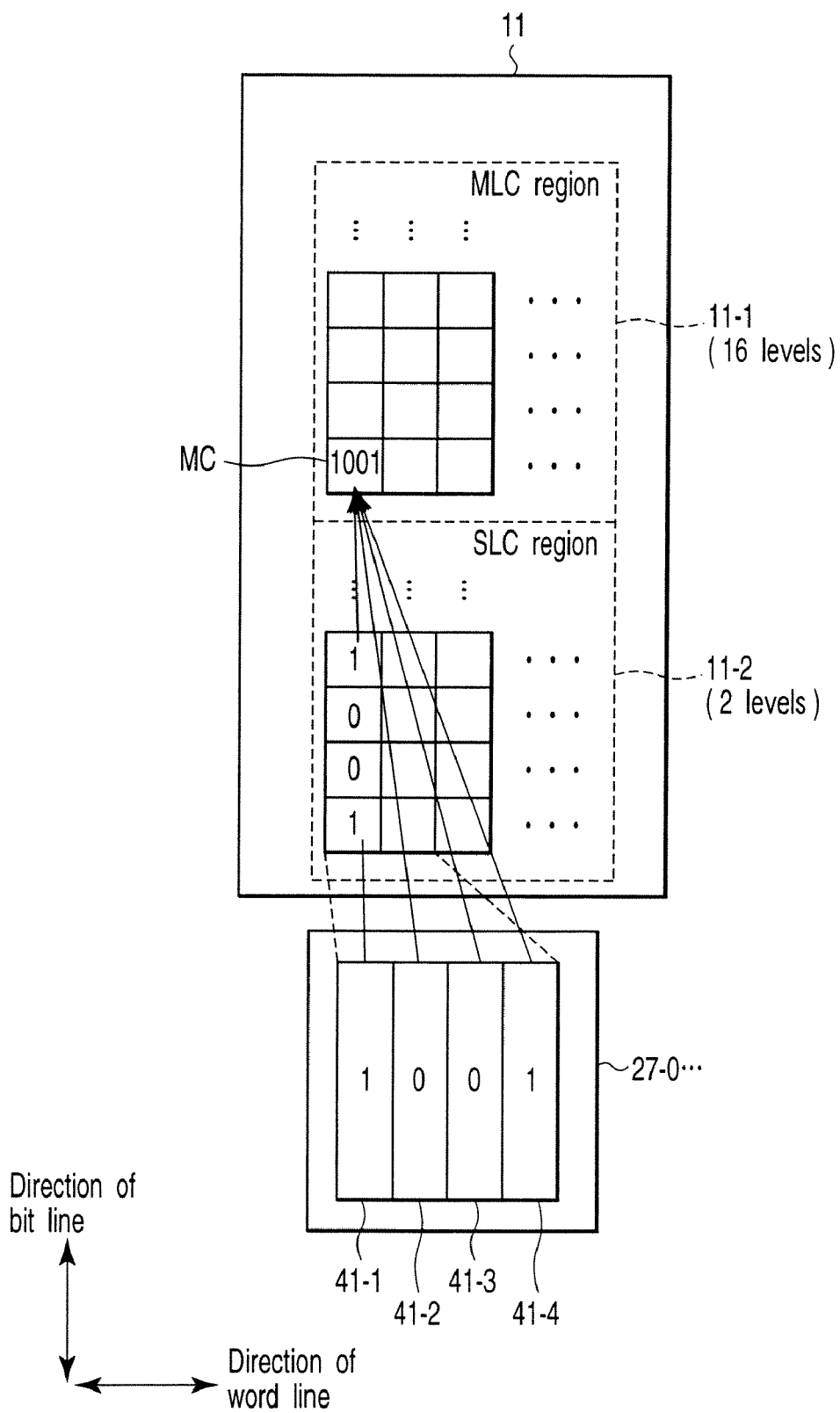
FIG. 13 is a diagram to help explain a write operation in the MLC region of the semiconductor memory device of the first embodiment.

Then, as shown in FIG. 13, an arbitrary page in the MLC region 11-1 is selected and a multilevel write operation is started.

Specifically, data "1", "0", "0", and "1" stored in the data caches 41-1 to 41-4 are written into a single memory cell MC in the MLC region 11-1.

As a result, compressing is done by rewriting data "1", "0", "0", and "1" stored in four memory cells MC in the SLC region 11-2 into a single memory cell MC in the MLC region 11-1.

As described above, the "compression" is defined as writing a plurality of items of data stored in the SLC region 11-2 into the MLC region 11-1 without reducing the number of bits in the data. In this respect, the "compression" differs from compression meaning that the number of bits in data is reduced and the resulting data is stored as in the case of, for example, a DRAM (Dynamic Random Access Memory).

By a similar operation, the compressed data can be decompressed. For example, in the embodiment, data "1", "0", "0", and "1" stored in the single memory cell MC in the MLC region 11-1 can be rewritten into the four memory cells MC in the SLC region 11-2. Specifically, the control signal generator circuit 17 and data conversion control circuit 20 store a plurality of items of data read from the MLC region 11-1 into a plurality of data caches 41-1 to 41-4. Then, the memory cell array 11 and data storage circuit 27 are controlled in such a manner that an arbitrary number of bits in the plurality of items of data stored in the plurality of data caches 41-1 to 41-4 are caused to be stored in the memory cells in the SLC region 11-2 whose address has been selected according to the number of bits in the memory cell in the SLC region 11-2.

Similarly, the "decompression" is defined as writing the data stored in the MLC region 11-1 into the SLC region 11-2 without decreasing the number of bits in the data. In this respect, the "decompression" differs from decompression meaning that the number of bits in data is increased and the resulting data is stored as in the case of, for example, a DRAM. As described above, the "compression" and "decompression" differ from those in a DRAM or the like in that the number of bits in data neither increases nor decreases and is constant, but the number of cells to be written into increases or decreases.

As described above, the semiconductor memory device of the embodiment produces at least the effects in item (1) to item (3) described below.

(1) The semiconductor memory device has the advantage of making the capacity larger and the operating speed higher.

As described above, the semiconductor memory device of the embodiment includes the MLC region 11-1 which uses multilevel NAND flash memories capable of recording multi bits of data into a single memory as memory cells MC and the SLC region 11-2 which uses single-level NAND flash memories capable of recording 1 bit of data into a single memory cell as memory cells MC.

After single-level writing into the SLC region 11-2 has been completed (ST1, ST2), 1-bit data written in the SLC region is read and stored temporarily into the data caches 41-1 to 41-4 (ST3 to ST5). These items of data can be written again as multi-bit data into the MLC region 11-2 (ST6).

As described above, since the data written in the SLC region 11-2 can be written as multi-bit data again into the MLC region 11-2, the data can be compressed, enabling a larger amount of data to be stored, which is advantageous in making the capacity higher. For example, in the embodiment, data "1", "0", "0", and "1" stored in four memory cells MC in the SLC region (single level) 11-2 can be compressed and stored in a single memory cell MC in the MLC region (16 levels) 11-1.

Moreover, the data storage circuit 27 of the embodiment is provided with a plurality of data caches 41-1 to 41-4.

Therefore, a plurality of items of data can be stored into the data storage circuit 27 at the same time, which is advantageous in making the capacity higher. Moreover, since in the embodiment, the data storage circuit 27 includes four data caches 41-1 to 41-4, four bits can be distinguished. Accordingly, 16 threshold distributions can be formed from a single threshold distribution at the same time in one write operation, which is advantageous to speeding up.

It is known that the multilevel NAND flash memory of the memory cell MC in the MLC region 11-1 requires, for example, about two to three times the data write time and erase time of the single-level NAND flash memory. Therefore, the multilevel NAND flash memory is considered to be disadvantageous to speeding up.

Figure 14:
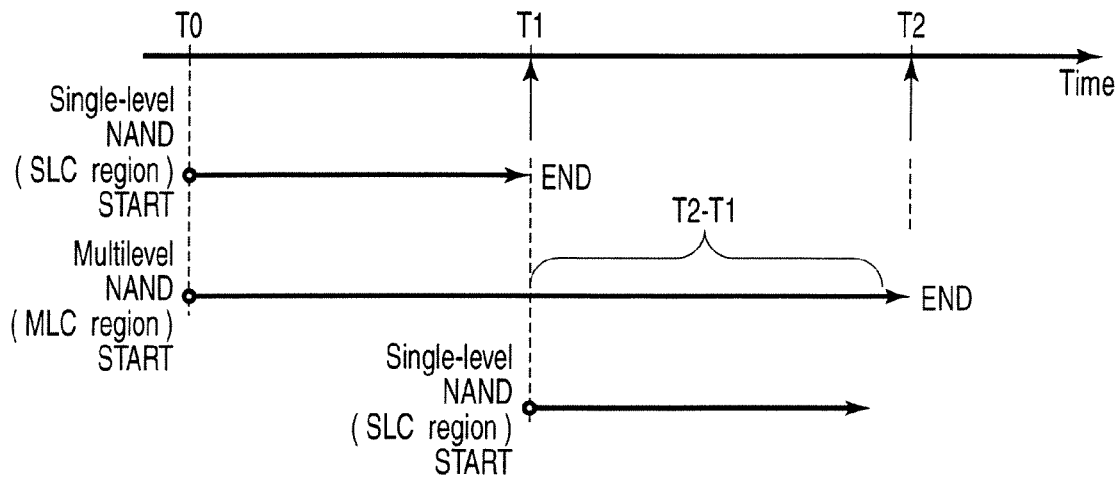
FIG. 14 is a diagram to help explain the write time in the SLC region and MLC region of the semiconductor memory device of the first embodiment.

However, in the embodiment, as shown in FIG. 14, after the single-level NAND flash memory (SLC region 11-2) has been written into at time T1, 1-bit data written in the SLC region is read and stored temporarily in the data caches 41-1 to 41-4. At time T2, the data can be written as multi-bit data again into the multilevel NAND flash memory (MLC region 11-1).

Accordingly, the use of the single-level NAND flash memory (SLC region) whose operating speed is faster can be started at time T1. Here, if the time required for writing in the multilevel NAND flash memory is from time T0 to time T2, the write speed can be increased by about the difference between them, or time T2 to time T1.

For example, in the embodiment, the interval between time T0 and time T1 is about 200 μs and the interval between time T0 and T2 is about 6 ms. Therefore, for example, the write speed can be increased by about 5.8 ms per page.

As described above, the semiconductor memory device of the embodiment is advantageous to the increase of the capacity and speeding up.

(2) The flexibility of the control signal generator circuit 17 can be increased and therefore the burden of designing the control signal generator circuit 17 can be decreased.

The data storage circuit 27 of the embodiment includes a plurality of data caches 41-1 to 41-4.

Therefore, as shown in FIGS. 9 to 11, after data are input consecutively into all the data caches 41-1 to 41-4, all the data stored in the data caches 41-1 to 41-4 can be written consecutively into four memory cells in the SLC region (consecutive write operations). In this case, as shown in the interval between time t1 to time t2 in FIG. 9, the continuous standby time of the data storage circuit 27 can be lengthened, which is advantageous.

Moreover, as shown in FIGS. 6 to 9, after data is input into a single data cache 41-1, the data stored in the data cache 41-1 is written into the selected single memory cell MC in the SLC region 11-2 (single write operation). In this case, as shown in the interval between time t1 and time t2 in FIG. 6, the standby time of the data storage circuit 27 can be shortened, which is advantageous.

As described above, since consecutive write operations or a single write operation can be selected as needed, the flexibility of the control signal generator circuit 17 can be increased and therefore the burden of designing the control signal generator circuit 17 can be decreased.

(3) The deterioration of the data retention characteristic can be prevented, which improves the reliability.

Generally, a flash memory has the following characteristic (data retention characteristic): as writing is done repeatedly, the cell characteristic deteriorates and the data retaining capability decreases. Moreover, it is known that the single-level NAND flash memory has a higher data retention than that of the multilevel NAND flash memory cell.

In the embodiment, the control signal generator circuit 17 specifies an address in such a manner that frequently rewritten data is written into the SLC region 11-2 and less frequently rewritten data is written into the MLC region 11-1, thereby controlling the memory cell array 11 and data storage circuit 27.

As described above, the control signal generator circuit 17 has the function (or leveling function) of specifying an address so as to prevent write operations from concentrating on a specific memory cell MC to decentralize write operations. Therefore, the deterioration of the data retention characteristic can be prevented, which enables the reliability to be improved.

[First Modification (Another Example of Step ST3)]

Figure 15:
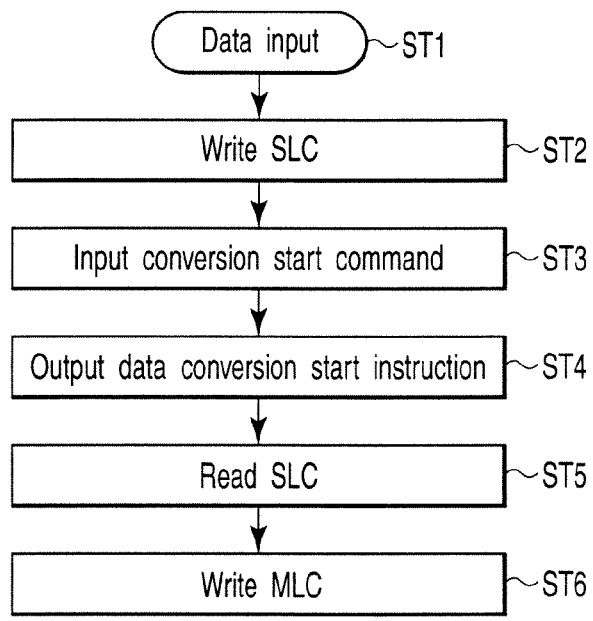
FIG. 15 is a flowchart to help explain a write operation and a read operation in a semiconductor memory device according to a first modification of the embodiment.
Figure 16:
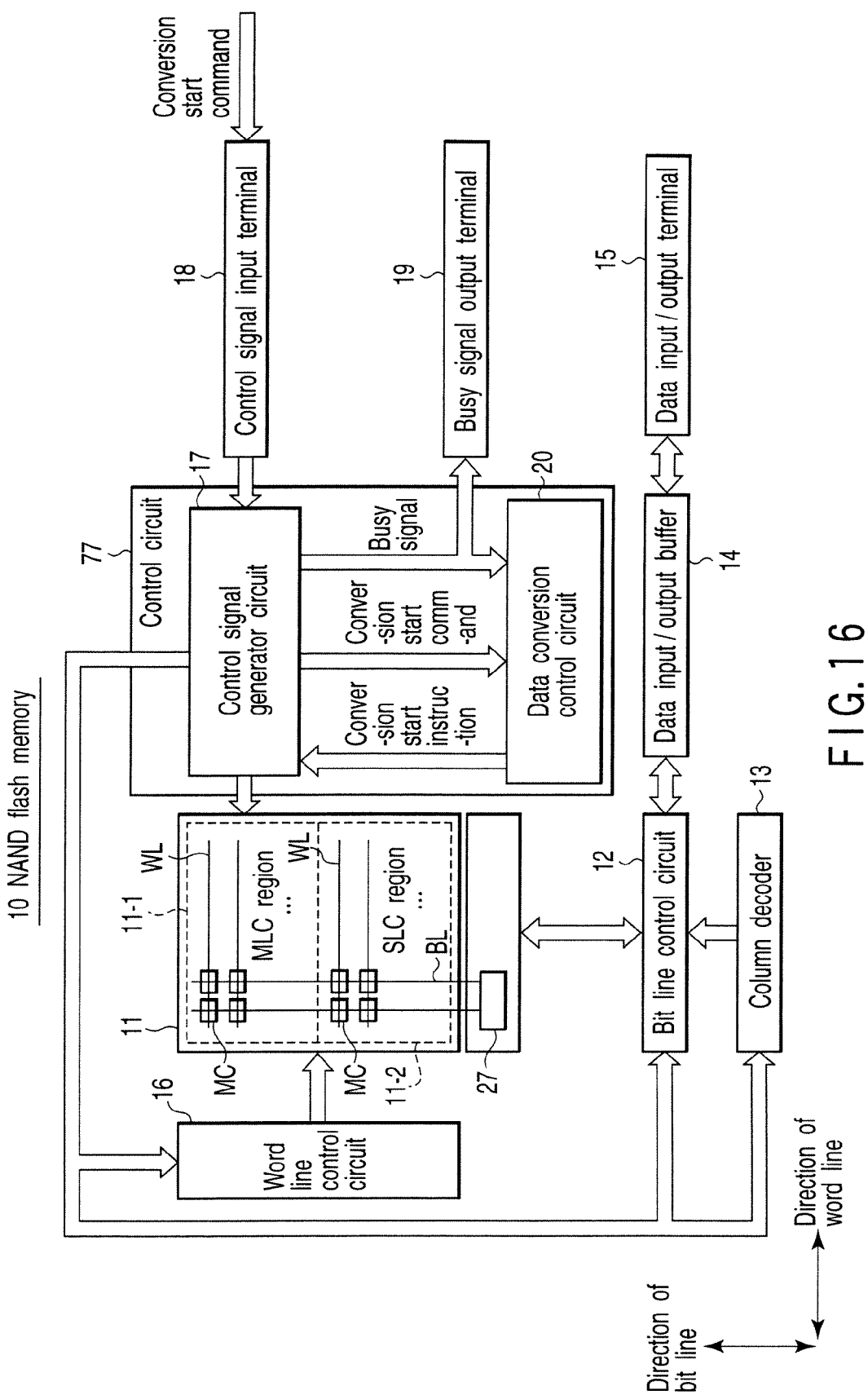
FIG. 16 is a block diagram of the semiconductor memory device according to the first modification.

Next, a semiconductor memory device according to a first modification of the first embodiment will be explained using FIGS. 15 and 16. FIG. 15 is a flowchart to help explain a write operation and a read operation in the first modification. FIG. 16 is a block diagram of a semiconductor memory device according to the first modification. The first modification relates to another example of step ST3 where the instruction to start data conversion from the SLC region to the MLC region explained in the first embodiment. In the description below, a detailed explanation of the parts overlapping with those in the first embodiment will be omitted.

As shown in FIG. 16, the semiconductor memory device of the first modification differs from that of the first embodiment in that it has no timer in the data conversion control circuit 20. In the operation, the first modification differs from the first embodiment in that a conversion start command is received from the control signal input terminal 18.

(Step ST3)

As shown in FIG. 16, a conversion start command is input from the outside via the control signal input terminal 18 to the control signal generator circuit 17. Then, receiving the conversion start command, the control signal generator circuit 17 outputs the conversion start command to the data conversion control circuit 20.

(Step ST4)

Then, receiving the conversion start command, the data conversion control circuit 20 outputs a conversion start instruction to the control signal generator circuit 17.

Hereinafter, when receiving the conversion start instruction, the control signal generator circuit 17 carries out the same steps ST5 and ST6 as those in the first embodiment, thereby performing the same write operation and read operation. The remaining configuration is the same as that of the first embodiment.

The semiconductor memory device according to the first modification produces the same effects as those in item (1) to item (3).

Furthermore, according to the first modification, a conversion start command is input from the outside to the control signal generator circuit 17. The data conversion control circuit 20 outputs a conversion start instruction to the control signal generator circuit 17. Therefore, for example, even before a specific time has passed, the data conversion control circuit 20 can output a conversion start instruction immediately as needed. Accordingly, the time required to start to read data from the SLC region 11-2 (ST5) can be made shorter, which is advantageous to speeding up.

Moreover, the semiconductor memory device of the first modification need not provide a timer in the data conversion control circuit 20. Therefore, the area occupied by the data conversion control circuit 20 can be decreased, which is advantageous to miniaturization.

[Second Modification (Another Example of the Number of Bits in the MLC Region 11-1)]

Figure 17:
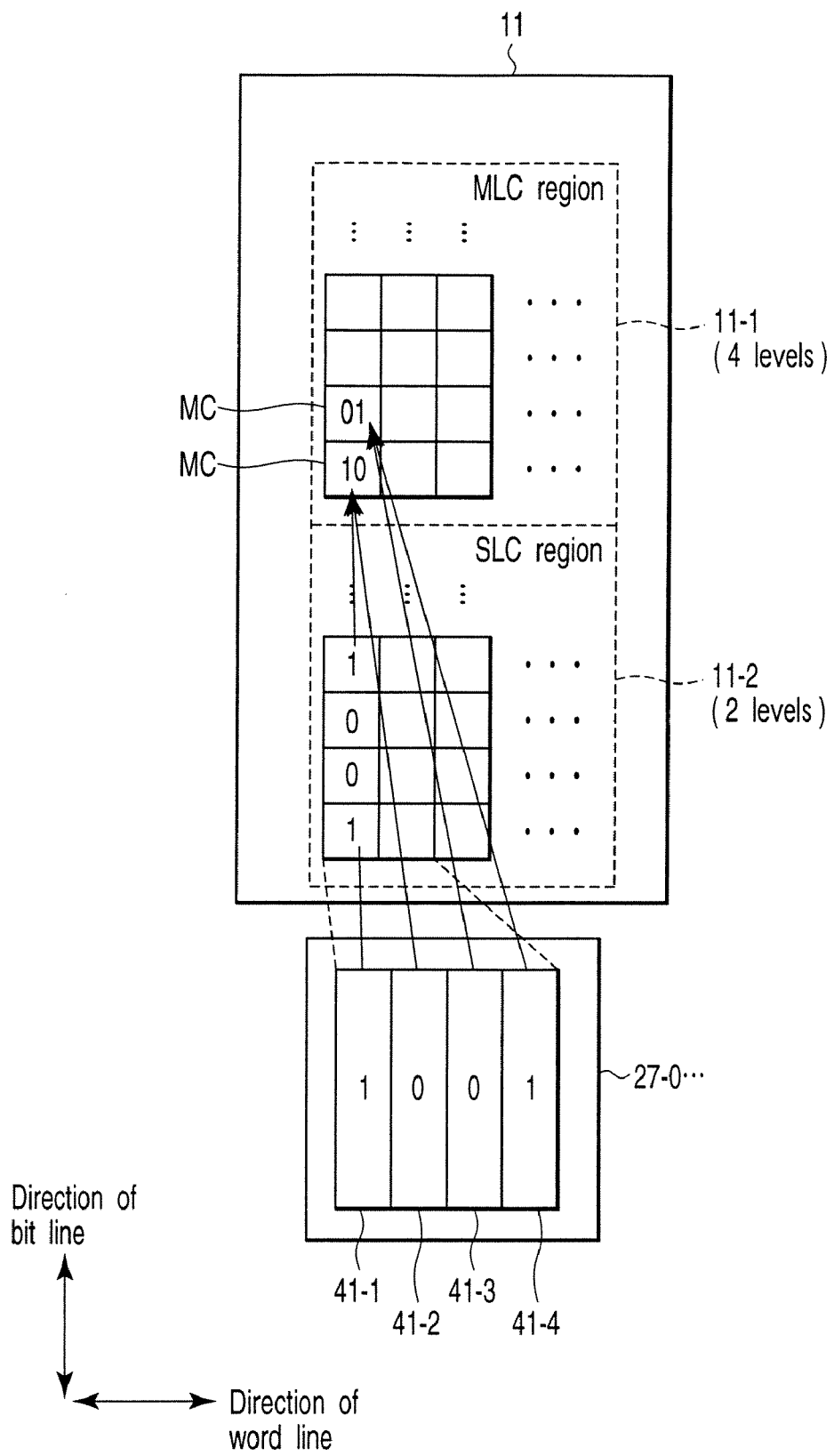
FIG. 17 is a diagram to help explain a write operation in the MLC region of a semiconductor memory device according to a second modification of the embodiment.

Next, a semiconductor memory device according to a second modification of the first embodiment will be explained using FIG. 17. FIG. 17 is a diagram to help explain a write operation (ST6) in the MLC region in the second modification. The second modification relates to another example of the number of bits in the MLC region. In the description below, a detailed explanation of the parts overlapping with those in the first embodiment will be omitted.

As shown in FIG. 17, the second modification differs from the first embodiment in that the number of bits in a multilevel NAND flash memory functioning as a memory cell MC in the MCL region 11-1 is 2 bits (4 levels).

Therefore, when data is compressed from the SLC region 11-2 into the MLC region 11-1 in step ST6, the data "1" and "0" stored in the data caches 41-1, 41-2 are written into the selected single memory cell MC (4 levels) in the MLC region 11-1.

Then, data "0" and "1" stored in the data caches 41-3, 41-4 are written into the selected single memory cell MC (4 levels) in the MLC region 11-1, which completes the data compressing operation in step ST6. The remaining configuration is the same as that of the first embodiment.

The semiconductor memory device according to the second modification produces the same effects in item (1) to item (3).

Furthermore, in the semiconductor memory device of the second modification, the number of bits in the multilevel NAND flash memory functioning as a memory cell MC in the MCL region 11-1 is 2 bits (4 levels). As described above, the semiconductor memory device includes a plurality of data caches 41-1 to 41-4, it can deals with the number of bits in the MLC region 11-1. Therefore, the second modification can be adapted to the number of bits in the multilevel flash memory functioning as a memory cell MC in the MCL region 11-1 as needed, which is advantageous.

Second Embodiment

Example of Providing a Controller

Figure 18:
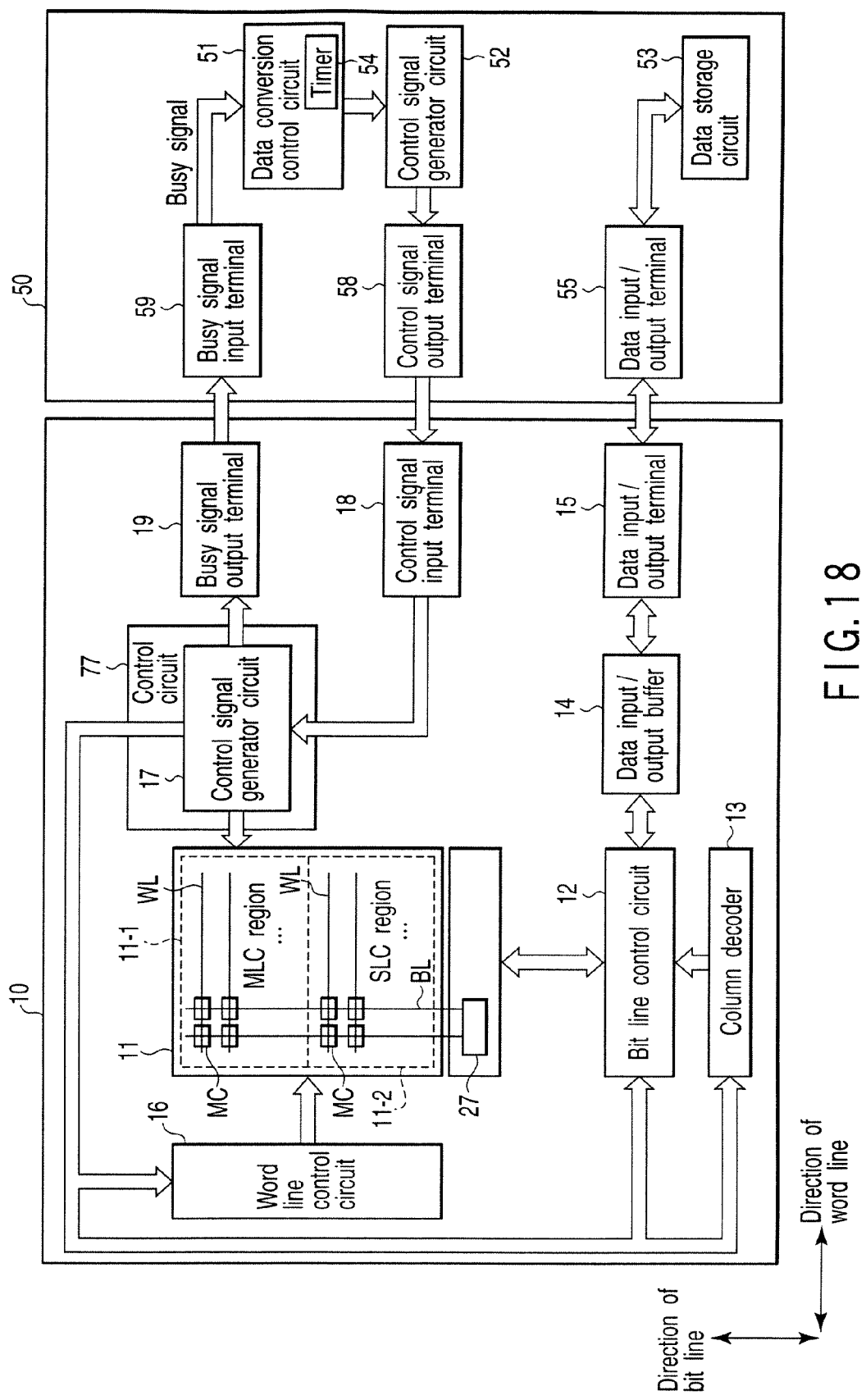
FIG. 18 is a block diagram of a semiconductor memory device according to a second embodiment of the invention.

Next, using FIG. 18, a semiconductor memory device according to a second embodiment of the invention will be explained. FIG. 18 is a block diagram of a semiconductor memory device according to the second embodiment. The second embodiment relates to an example of further providing a controller 50. In the description below, a detailed explanation of the parts overlapping with those in the first embodiment will be omitted.

As shown in FIG. 18, the semiconductor memory device according to the second embodiment differs from the first embodiment in the following points.

The semiconductor memory device of the second embodiment further includes a controller 50. Moreover, the second embodiment differs from the first embodiment in that the NAND flash memory 10 does not have the data conversion control circuit 20.

The controller 50 is configured to manage the physical state of the inside of the NAND flash memory 10 (for example, in what block address what number logical sector address data is included or which block is in the erased state). The controller 50 may be configured to perform data input/output control of the NAND flash memory 10, manage data, add ECC in writing data, and analyze an error correction code ECC in reading.

The controller 50 includes a data conversion control circuit 51, a control signal generator circuit 52, a data storage circuit 53, a data input/output terminal 55, a control signal output terminal 58, and a busy signal input terminal 59.

The data conversion control circuit 51 includes a timer 54 for sensing the passage of a specific time. The data conversion control circuit 51 is configured to receive the busy signal input via the busy signal input terminal 59 and output a conversion start instruction to the control signal generator circuit 52.

The control signal generator circuit 52 is configured to control the control signal generator circuit 17 in the memory 10 after receiving the conversion start instruction so as to carry out steps ST5 and ST6.

The data input/output terminal 55, control signal output terminal 58, and busy signal input terminal 59 are configured to function as an interface in performing transmission and reception between the NAND flash memory 10 and controller 50.

The controller 50 controls the memory cell array 11 via the control signal generator circuit 17 so as to carry out the same write and read operations as those in the first embodiment. In the operations, the data read from the SLC region 11-2 may be stored temporarily into the data storage circuit 53 in the controller 50.

Furthermore, the control signal generator circuit 52 may be configured to have the leveling function of specifying an address to decentralize the memory cells MC to be written into in the SLC region 11-2 or MLC region 11-1.

Third Embodiment

Example of Providing an SLC Region/MLC Region Defining Circuit

Figure 19:
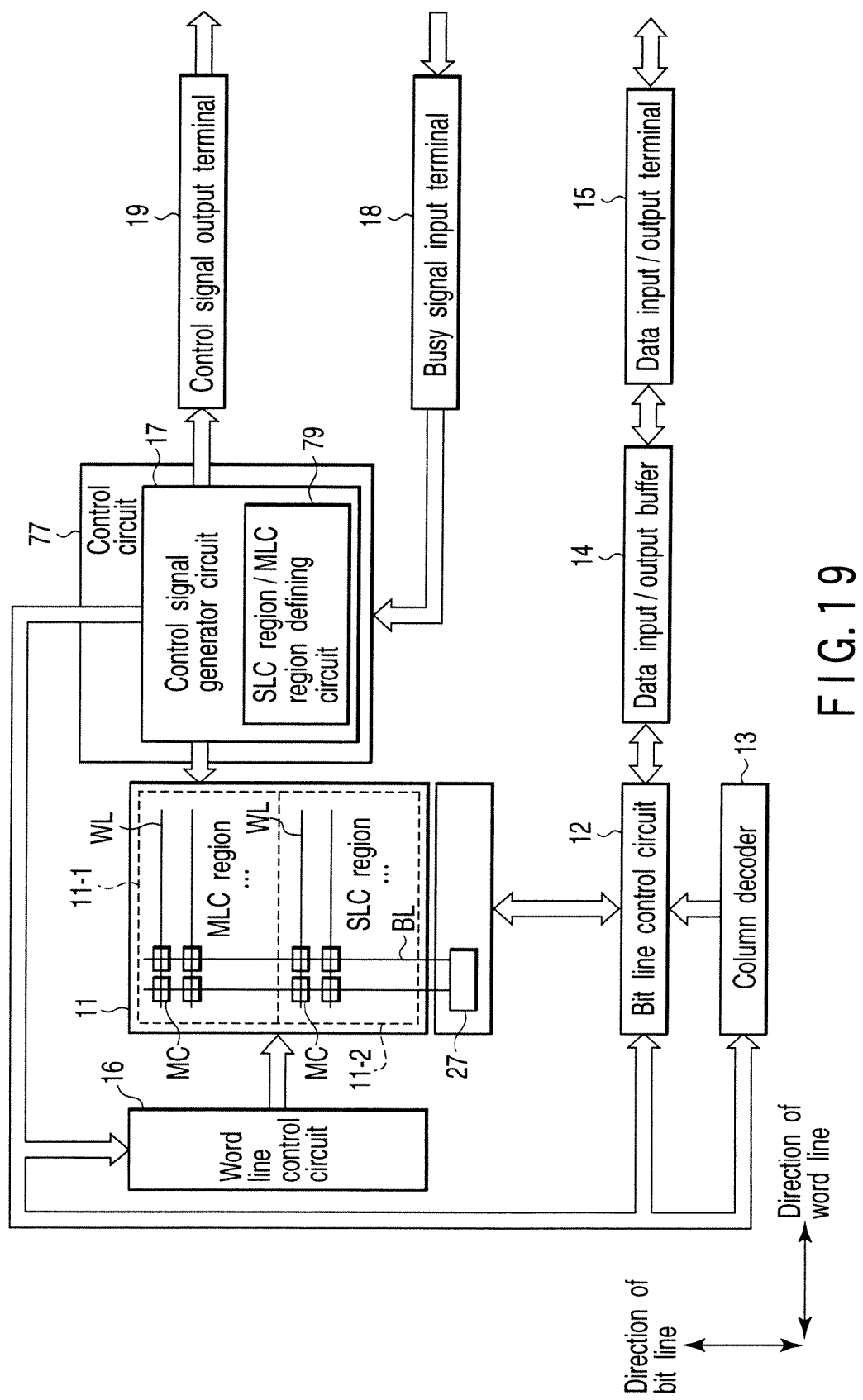
FIG. 19 is a block diagram of a semiconductor memory device according to a third embodiment of the invention.

Next, using FIG. 19, a semiconductor memory device according to a third embodiment of the invention will be explained. FIG. 19 is a block diagram of a semiconductor memory device according to the third embodiment. The third embodiment relates to an example of further providing an SLC region/MLC region defining circuit. In the description below, a detailed explanation of the parts overlapping with those in the first embodiment will be omitted.

As shown in FIG. 19, the semiconductor memory device differs from that of the first embodiment in that the control signal generator circuit 17 includes an SLC region/MLC region defining circuit 79.

The SLC region/MLC region defining circuit 79 is configured to define either the SLC region 11-2 or MLC region 11-1 in each block, a region in the memory cell array 11.

Therefore, for example, when an instruction to the effect that "Do writing in the SLC region 11-2" is externally input from the control signal input terminal 19 to the control signal generator circuit 17, the control signal generator circuit 17 refers to the SLC region/MLC region defining circuit 79.

Then, the control signal generator circuit 17 selects one from the blocks defined as the SLC region 11-2 and starts the write operation.

<Initial State>

Next, using FIG. 20, the operation of the SLC region/MLC region defining circuit 79 in the initial state of the memory cell array 11 will be explained. As shown in FIG. 20, the memory cell array 11 is composed of block 0 to block 23, or a total of 1024 blocks.

In this case, in the SLC region/MLC region defining circuit 79, for example, block 0 to block 63 are defined as the SLC region 11-2 and block 64 to block 1023 are defined as the MLC region 11-1. Writing, reading, erasing, and others are done under these definitions.

<Using State>

Next, the operation of the SLC region/MLC region defining circuit 79 when the memory cell 11 is in operation will be explained.

When using the MLC region 11-1 (for example, in a write operation), the SLC region/MLC region defining circuit 79 stores into the memory cell array 11 information on how many times which block was written into and/or read out.

For example, the SLC region/MLC region defining circuit 79 stores into a specific block, such as block 0, the number of times block 64 to block 1023 in the MLC region 11-1 were written into or/and read from. Alternatively, the invention is not limited to a specific block, such as block 0. For instance, each block may be provided with a region for storing the number of times writing or/and reading was done. In this case, for example, the begin bits (16 bits) of word line WL31 in each of block 64 to block 1024 can be considered.

Then, when the number of write/read operations has exceeded a certain upper limit, the SLC region/MLC region defining circuit 79 changes the definition of the SLC region 11-2 or MLC region 11-1.

For example, consider a case where the upper limit of the number of write/read operations is 1000. In this case, when the number of write/read operations in the block 64 has reached 1001, the SLC region/MLC region defining circuit 79 changes the definition of block 0 to block 63 as the SLC region 11-2 and defines block 0 to block 64 as the SLC region 11-2. That is, the SLC region/MLC region defining circuit 79 changes block 64 defined as the MLC region 11-1 whose number of write/read operations has exceeded a certain upper limit to the definition of the SLC region 11-2.

The semiconductor memory device according to the third embodiment produces the same effects in item (1) to item (3).

Furthermore, in the semiconductor memory device of the third embodiment, the control signal generator circuit 17 includes the SLC region/MLC region defining circuit 79.

Therefore, a memory cell MC whose number of write/read operations has exceeded a certain upper limit and whose reliability is so degraded that it cannot be used as the MLC region 11-1 can be reused as the SLC region 11-2.

The reason is that the SLC region 11-2 has higher resistance to the deterioration of the data reliability caused by the repetition of write/read operations than the MLC region 11-1. For example, in the example, the resistance of the SLC region 11-2 to the deterioration of the data reliability is more than 10 to 100 times that of the MLC region 11-1.

In the embodiments and modifications, the number of bits in a memory cell in the SLC region 11-2 has been 2 and the number of bits in a memory cell in the MLC region 11-1 has been 16 and 4. However, the number of bits in a memory cell in each of the SLC region 11-2 and MLC region 11-1 is not limited to these. The invention can be applied to a case where the number of bits in a memory cell in the MCL region 11-1 is larger than the number of bits in a memory cell in the SLC region 11-2.

For example, when the number of bits in a memory cell in the SLC region 11-2 is n bits (n is a natural number), the number of bits in a memory cell in a multilevel NAND flash memory may be 8, k (k>n: n is a natural number), or another value.

Furthermore, the number of bits in the data caches 41-1 to 41-4 in the data storage circuit 27 is not limited to the number of bits in the embodiments. As long as the number of bits in the data storage circuit 27 is i bits (i>n: n is a natural number) larger than the number of bits (n bits) in a memory cell in the SLC region 11-2, the same effect can be obtained.

Moreover, the memory cell MC is not limited to a NAND flash memory. For example, another nonvolatile memory, such as an AND flash memory, may be used as the memory cell MC.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
   a memory cell array which includes a first region that has a plurality of predetermined first block regions in the memory cell array and has a plurality of memory cells each capable of storing n-bit data (n is a natural number) and a second region that has a plurality of predetermined second block regions in the memory cell array and has a plurality of memory cells each capable of storing k-bit data (k>n: k is a natural number);
   a data storage circuit which includes a plurality of data caches; and
   a control circuit which controls the memory cell array and the data storage circuit in such a manner that the k-bit data read from the k/n (k divided by n) number of memory cells in the first region are stored into the data storage circuit and the k-bit data are stored into the memory cells in the second region,
   wherein the data storage circuit further includes:
   an amplifier circuit which amplifies the data from the data caches; and
   a latch circuit which temporarily stores data to be transferred from a data input/output terminal to the data caches, or from the data caches to the data input/output terminal.

2. The semiconductor memory device according to claim 1, wherein the control circuit stores the data read from the second region into the k-bit data cache and further stores the data stored in said plurality of data caches into the k/n number of memory cells in the first region.

3. The semiconductor memory device according to claim 1, wherein the number of bits in the data storage circuit is i bits larger than n bits (i>n: i is a natural number) in a memory cell in the first region.

4. The semiconductor memory device according to claim 1, wherein the control circuit controls the data storage circuit so as to store a plurality of items of data into said plurality of data caches.

5. The semiconductor memory device according to claim 1, wherein the control circuit includes a control signal generator circuit which controls the memory cell array by specifying an address so as to write frequently rewritten data into the first region and less frequently rewritten data into the second region in a write operation.

6. The semiconductor memory device according to claim 5, wherein the control circuit further includes a data conversion control circuit which has a timer that counts a specific time during which the control signal generator circuit outputs no control signal and which, when the specific time has elapsed, determines that the data storage circuit is in a standby state and outputs a data conversion start instruction to the control signal generator circuit.

7. The semiconductor memory device according to claim 5, wherein the control circuit further includes a data conversion control circuit which, receiving a conversion start command output from the control signal generator circuit, outputs a conversion start instruction to the control signal generator circuit.

8. The semiconductor memory device according to claim 1, further comprising a controller which controls the control circuit.

9. The semiconductor memory device according to claim 8, wherein the controller includes a data conversion control circuit which has a timer that counts the passage of a specific time and, receiving a control signal output from the control circuit, outputs a conversion start instruction.

10. The semiconductor memory device according to claim 1, wherein the control circuit further includes a region defining circuit which defines a region in the memory cell array as either the first region or second region.

11. A semiconductor memory device comprising:
a memory cell array which include a first region that has a plurality of predetermined first block regions in the memory cell array and has a plurality of memory cells each capable of storing n-bit data (n is a natural number) and a second region that has a plurality of predetermined second block regions in the memory cell array and has a plurality of memory cells each capable of storing k-bit data (k>n: k is a natural number);
a data storage circuit which includes a plurality of data caches; and
a control circuit which controls the memory cell array and the data storage circuit so as to decentralize write operations by specifying an address in the memory cell array to prevent write operations from concentrating on a specific one of the memory cells,
wherein the data storage circuit further includes:
an amplifier circuit which amplifies the data from the data caches; and
a latch circuit which temporarily stores data to be transferred from the data input/output terminal to the data caches, or from the data caches to the data input/output terminal.

12. The semiconductor memory device according to claim 11, wherein the control circuit controls the memory cell array and the data storage circuit in such a manner that the k-bit data read from the k/n (k divided by n) number of memory cells in the first region are stored into the data storage circuit and the k-bit data are stored into the cells in the second region.

13. The semiconductor memory device according to claim 11, wherein the control circuit stores the data read from the second region into the k-bit data cache and further stores the data stored in said plurality of data caches into the k/n (k divided by n) number of memory cells in the first region.

14. The semiconductor memory device according to claim 11, wherein the number of bits in the data storage circuit is i bits larger than n bits (i>n: i is a natural number) in a memory cell in the first region.

15. The semiconductor memory device according to claim 11, wherein the control circuit controls the data storage circuit so as to store a plurality of items of data into said plurality of data caches.

16. The semiconductor memory device according to claim 11, wherein the control circuit further includes
a control signal generator circuit which outputs a control signal, and
a data conversion control circuit which has a timer that counts a specific time during which the control signal is not output and which, when the specific time has elapsed, determines that the data storage circuit is in a standby state and outputs a data conversion start instruction to the control signal generator circuit.

17. The semiconductor memory device according to claim 11, wherein the control circuit further includes
a control signal generator circuit which outputs a conversion start command, and
a data conversion control circuit which, receiving the conversion start command, outputs a conversion start instruction to the control signal generator circuit.

18. The semiconductor memory device according to claim 11, further comprising a controller which controls the control circuit.

19. The semiconductor memory device according to claim 18, wherein the controller includes a data conversion control circuit which has a timer that counts the passage of a specific time and, receiving a control signal output from the control circuit, outputs a conversion start instruction.

20. The semiconductor memory device according to claim 12, wherein the control circuit further includes a region defining circuit which defines a region in the memory cell array as either the first region or second region.

* * * * *